United States Patent
Lee et al.

(10) Patent No.: US 7,842,601 B2
(45) Date of Patent: Nov. 30, 2010

(54) METHOD OF FORMING SMALL PITCH PATTERN USING DOUBLE SPACERS

(75) Inventors: Ji-young Lee, Yongin-si (KR); Joon-soo Park, Seongnam-si (KR); Sang-gyun Woo, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 1054 days.

(21) Appl. No.: 11/407,295

(22) Filed: Apr. 20, 2006

(65) Prior Publication Data

US 2006/0240361 A1    Oct. 26, 2006

(30) Foreign Application Priority Data

Apr. 21, 2005    (KR)    .............. 10-2005-0033205

(51) Int. Cl.
*H01L 21/4763* (2006.01)

(52) U.S. Cl. .............. 438/622; 438/623; 438/624; 438/625; 438/626

(58) Field of Classification Search .......... 438/622–626
See application file for complete search history.

(56) References Cited

U.S. PATENT DOCUMENTS

| | | | | |
|---|---|---|---|---|
| 5,399,518 A * | 3/1995 | Sim et al. | ................. | 438/396 |
| 5,444,005 A * | 8/1995 | Kim et al. | ................. | 438/396 |
| 5,484,744 A * | 1/1996 | Hong | ................. | 438/396 |
| 5,696,012 A * | 12/1997 | Son | ................. | 438/231 |
| 5,861,343 A * | 1/1999 | Tseng | ................. | 438/666 |
| 5,872,041 A * | 2/1999 | Lee et al. | ................. | 438/397 |
| 5,932,489 A * | 8/1999 | Huang | ................. | 438/717 |
| 6,051,469 A * | 4/2000 | Sheu et al. | ................. | 438/270 |
| 6,064,118 A * | 5/2000 | Sasaki | ................. | 257/758 |
| 6,277,727 B1 * | 8/2001 | Kuo et al. | ................. | 438/618 |
| 6,960,530 B2 * | 11/2005 | Wu et al. | ................. | 438/701 |
| 2004/0155351 A1 * | 8/2004 | Miyamoto et al. | ........... | 257/758 |
| 2005/0176207 A1 * | 8/2005 | Liu et al. | ................. | 438/306 |
| 2005/0215040 A1 * | 9/2005 | Doyle | ................. | 438/585 |
| 2006/0197230 A1 * | 9/2006 | Anezaki et al. | ............. | 257/774 |

FOREIGN PATENT DOCUMENTS

| | | |
|---|---|---|
| JP | 05-088375 | 4/1993 |
| KR | 100155880 | 7/1998 |
| KR | 1020020046040 | 6/2002 |

\* cited by examiner

*Primary Examiner*—Matthew C Landau
*Assistant Examiner*—James M Mitchell
(74) *Attorney, Agent, or Firm*—Volentine & Whitt, PLLC

(57) ABSTRACT

A method of forming a small pitch pattern using double spacers is provided. A material layer and first hard masks are used and characterized by a line pattern having a smaller line width than a separation distance between adjacent mask elements. A first spacer layer covering sidewall portions of the first hard mask and a second spacer layer are formed, and spacer-etched, thereby forming a spacer pattern-shaped second hard mask on sidewall portions of the first hard mask. A portion of the first spacer layer between the first hard mask and the second hard mask is selectively removed. The material layer is selectively etched using the first and second hard masks as etch masks, thereby forming the small pitch pattern.

19 Claims, 17 Drawing Sheets

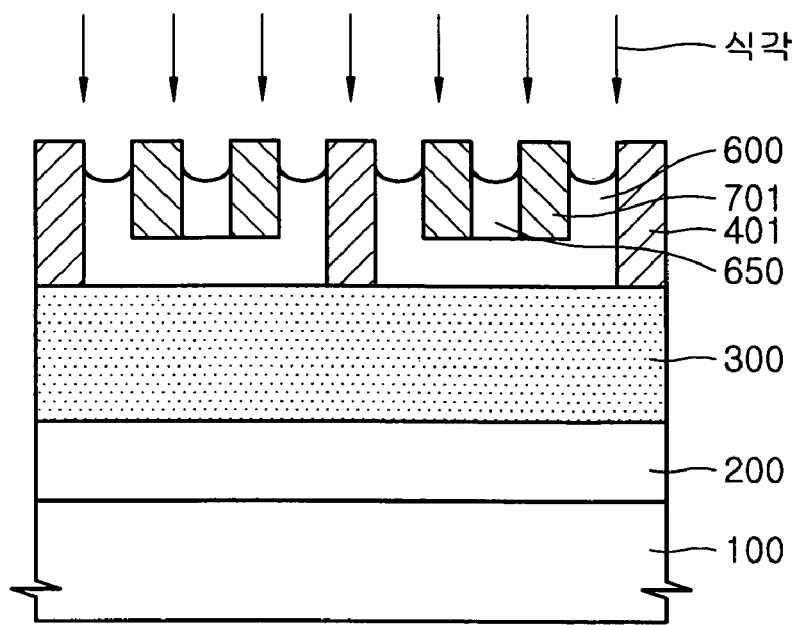
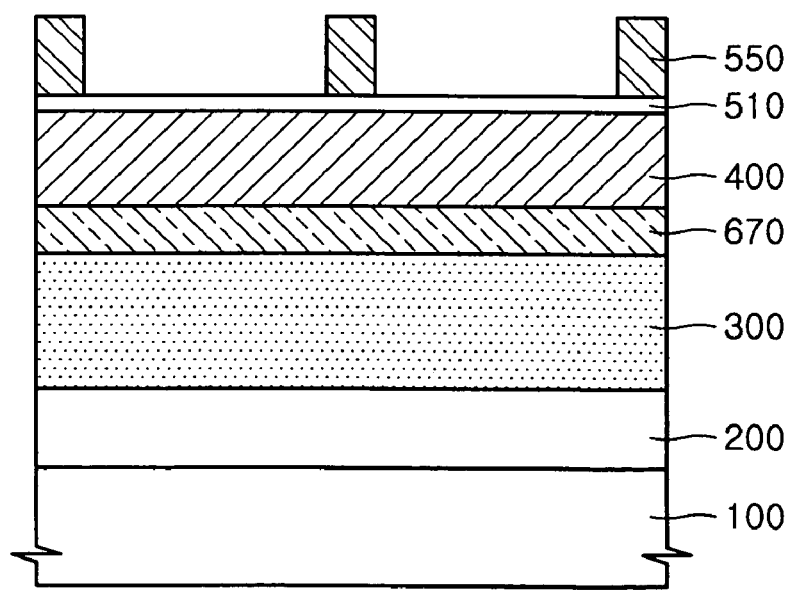

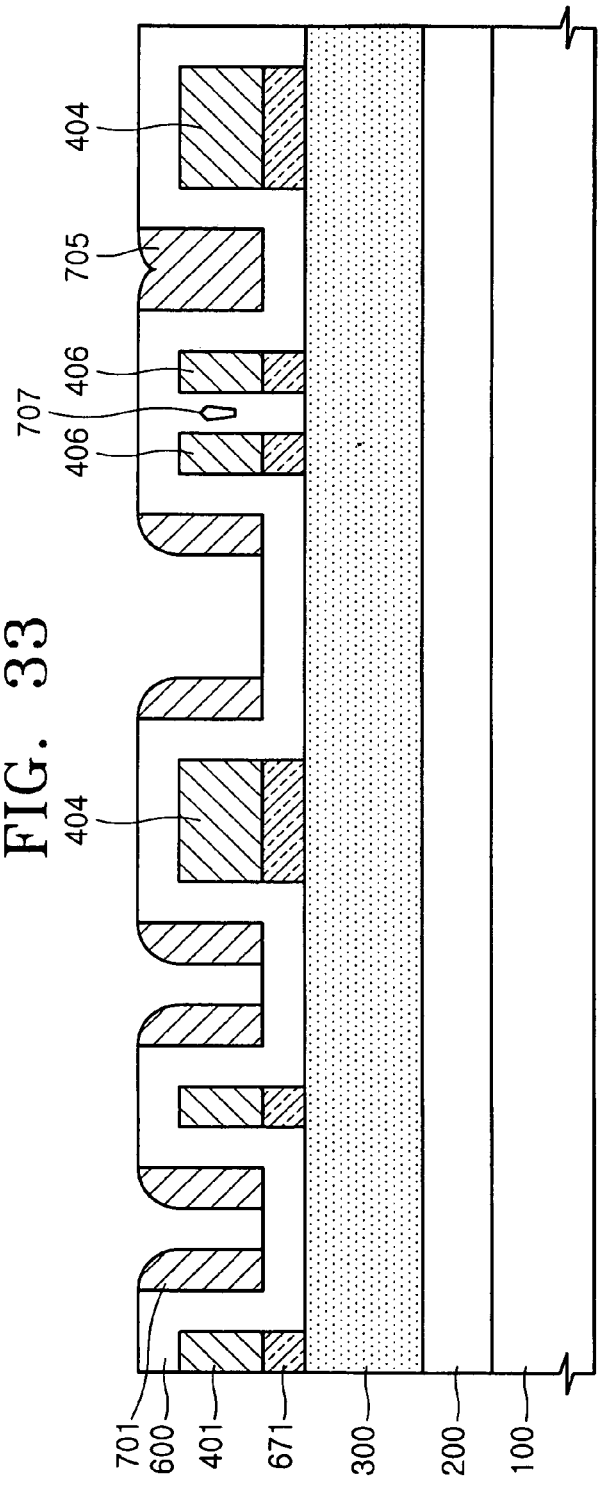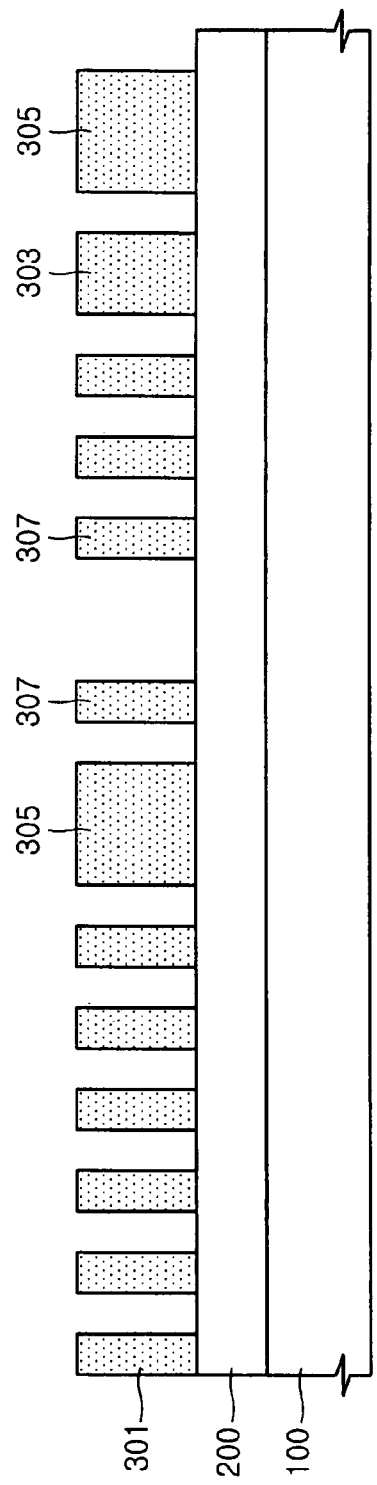

METHOD OF FORMING SMALL PITCH PATTERN USING DOUBLE SPACERS

BACKGROUND OF THE INVENTION

1. Field of the Invention

Embodiments of the invention relate to a semiconductor device fabrication method. More particularly, embodiments of the invention relate to a method of forming a small pitch pattern using double spacers.

This application claims the benefit of Korean Patent Application No. 2005-0033205 filed on Apr. 21, 2005, the subject matter of which is hereby incorporated by reference in its entirety.

2. Description of the Related Art

The fabrication of a semiconductor device requires the application of multiple individual processes such as lithography, material deposition, patterning, etching, cleaning, etc. As contemporary semiconductor devices increase in their constituent element densities, design rules for the layout of such elements have become increasingly small and very strict in their tolerances. Reduced design rules result in increasingly small pitch definitions for patterns used, for example, in lithography processes adapted to the fabrication of semiconductor devices. Such reduced design rules and reduced pattern pitches are beginning to challenge the resolution accuracy of conventional lithography equipment. Indeed, some contemporary design rules require resolution beyond that reasonably provided by some conventional.

For example, in one conventional lithography process adapted to the formation of a small pitch pattern of about 50 nm, an ArF immersion lithography technique is commonly used. This technique uses an ArF light source having a wavelength of 193 nm. Alternatively, a lithography process using a $F_2$ excimer laser having a shorter wavelength of 153 nm may ultimately be used, but this technique remains under development and has proved difficult to use in the formation patterns on a semiconductor substrate.

Thus, as a practical matter, lithography technology using a light source having a significantly longer wavelength, (e.g., lithography technology using a light source formed from a KrF excimer laser having a 248 nm wavelength) must still be used. Such equipment is, without successful adaptation, ill-suited to the formation of smaller pitch patterns, such as those having a pitch of about 50 nm or less. In particular, requirements exist for the developing of methods adapted to the formation of small pitch patterns of repeated lines and spaces using conventionally available lithography equipment such as the KrF excimer laser having a 248 nm wavelength as a light source.

SUMMARY OF THE INVENTION

Embodiments of the invention provide a method of forming small pitch patterns using lithography equipment having a light source of longer wavelength in the fabrication of a semiconductor device.

BRIEF DESCRIPTION OF THE DRAWINGS

The above and other features and advantages of the present invention will become more apparent upon consideration of several exemplary embodiments thereof with reference to the attached drawings in which:

FIGS. 21 through 23 are sectional views schematically illustrating a planarizing process in a method of forming small pitch patterns according to an embodiment of the invention;

FIGS. 24 through 30 are sectional views schematically illustrating a method of forming hard masks of double layer structures according to an embodiment of the invention;

FIGS. 33 and 34 are sectional views schematically illustrating a method of forming various pitch patterns together according to an embodiment of the invention.

DESCRIPTION OF EXEMPLARY EMBODIMENTS

Figure 1:
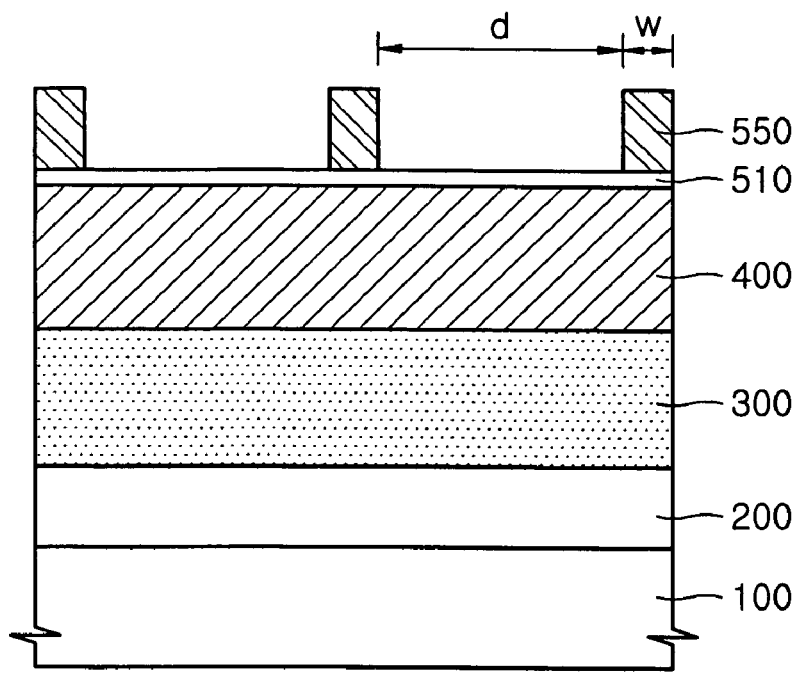
FIGS. 1 through 8 are sectional views schematically illustrating a method of forming small pitch patterns using double spacers according to an embodiment of the invention.

Several embodiments of the invention will now be described with reference to the accompanying drawings. The invention may, however, be embodied in many different forms and should not be construed as being limited to only the embodiments set forth herein. Rather, these embodiments are provided as teaching examples. Throughout this description and in the drawings like reference numbers refer to like or similar elements.

Embodiments of the invention provide a method for depositing double layers for double spacers on a small line pattern to cover the sidewall of the small line pattern, and performing a first spacer etch process on a second spacer layer to form a sidewall spacer. The double layers are deposited in such a manner that they extend to cover the sidewall of the small line pattern and to have a shape as if a spacer were attached in an axial direction.

An etch-back process or a spacer etch process is performed on the second spacer layer exposed by the first spacer, using a small line pattern and the first spacer as masks, thereby forming three line patterns. Thus, patterns may be formed having ⅓ the pitch as compared with the pitch of the initial small line pattern.

Embodiments of the invention are adapted to fabricate a line/space pattern having a pitch of about 45 nm using KrF excimer laser light source which has a relatively long 248 nm wavelength. That is, patterns having a much smaller pitch may be fabricated using conventionally available lithography equipment with relatively lower resolution. Thus, patterns having a very small pitch (e.g., in a range of about 45 nm) may be formed without using more complicated techniques or emerging lithography equipment, such as, for example, an $F_2$ excimer laser light source having a 153 nm wavelength, or ArF immersion lithography technology of which operates at a 193 nm wavelength.

FIGS. 1 through 8 are sectional views schematically illustrating a method of forming small pitch patterns using double spacers according to an embodiment of the present invention.

Referring to FIG. 1, a lower layer 200 is formed on a substrate 100, (e.g., a silicon substrate), and a material layer to be patterned 300 is formed on lower layer 200. Material layer 300 is the layer from which one or more small pitch patterns will be realized in illustrated embodiment.

These pitch patterns may be related to any number of elements to-be-formed on substrate 100. For example, material layer 300 may be patterned to form a gate structure, a bit line, and/or an active pattern subsequently used as part of a semiconductor device formed on substrate 100. In an exemplary case where material layer 300 will be formed into an active pattern, material layer 300 may be a semiconductor substrate. In another exemplary case where material layer 300 will be formed into a gate structure, material layer 300 may be a conductive layer (e.g., polysilicon) or a metal layer (e.g., a tungsten layer, or a tungsten silicide layer). In yet another exemplary case where material layer 300 will be formed into a bit line, material layer 300 may be a metal layer (e.g., tungsten or aluminum).

Alternatively, material layer 300 may be a hard mask adapted for use as a pattern to form a semiconductor device, a mold, or a layer for patterns such as damascene pattern. Material layer 300 may be a thermal oxide layer, a chemical vapor deposition (CVD) oxide layer, a HDP oxide layer, or an oxide layer such as USG, SOG, Fox, or the like. Material layer 300 may be a nitride layer such as SiON, SiN, SiBN, BN, and the like. Material layer 300 may be a material layer having a high dielectric constant, k.

In an exemplary case where material layer 300 will be used as a hard mask, lower layer 200 may be a layer to be patterned in accordance with the design of the hard mask patterned from material layer 300. Thus, lower layer 200 may in certain embodiments be a polycrystal structure silicon layer, a tungsten layer, a tungsten silicide layer, or an aluminum layer.

Regardless of the composition of material layer 300 and/or lower layer 200, a first hard mask layer 400 is formed on material layer 300. First hard mask layer 400 may be formed from a material having an etch selectivity with respect to that of material layer 300. First hard mask layer 400 may thus be readily adapted to pattern material layer 300 using an etch process.

A first photoresist pattern 550 adapted to the patterning of first hard mask layer 400 may then be formed on first hard mask layer 400 using a conventional lithography process. For example, in one embodiment, after an antireflection coating (ARC) layer 510 is formed on first hard mask layer 400, and a photoresist layer is deposited, an exposure and development process is performed, thereby forming first photoresist pattern 550. At this time, first photoresist pattern 550 is formed such that its line width "w" is smaller than a separation distance "d" between adjacent pattern elements in photoresist pattern 550. In one embodiment, the separation distance "d" may be at least five times the line width "w". However, the relationship between separation distance "d" and line width "w" are a matter of design choice and may range from a separation distance "d" many times that of line width "w" to a separation distance "d" that is equal to line width "w".

Line width "w" of first photoresist pattern 550 may be formed with a dimension equal to that of a line width for the small pitch pattern to be formed. For this purpose, a process of trimming the developed photoresist pattern 550 may be performed. However, since the separation distance "d" between pattern elements of first photoresist patterns 550 is sufficiently wide as described above, even though line width "w" may be 50 nm or less, (e.g., in a range from about 20 nm to 30 nm), first photoresist pattern 550 may be formed using a conventional lithography process having a relatively low resolution, such as a KrF lithography process.

Figure 2:
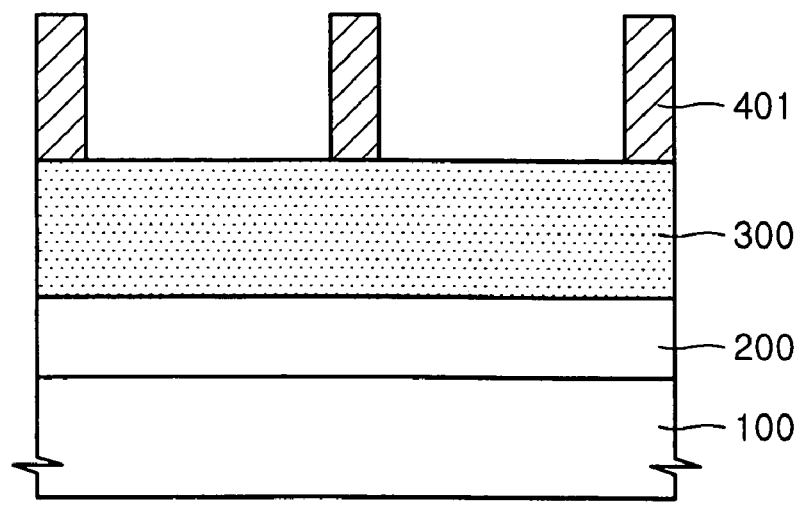

Referring to FIG. 2, first hard mask layer 400 is selectively, anisotropically etched and patterned using first photoresist pattern 550 as an etch mask to form a first hard mask 401 having a line width equal to the line width "w" of first photoresist pattern 550.

At this time, a selective etch may be performed using a wet etch or an isotropic etch such that the line width of first hard mask 401 is smaller than line width "w" of first photoresist pattern 550. Alternatively, first hard mask 401 may be patterned using a damascene process to have a narrow line width, (e.g., about 50 nm or less) without using first photoresist pattern 550 as described in reference to FIGS. 1 and 2.

Figure 3:
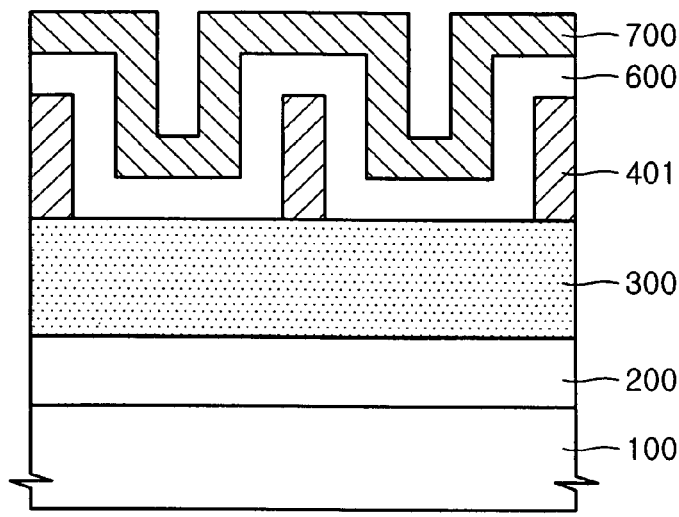

Referring to FIG. 3, first and second spacer layers, 600 and 700, are sequentially deposited to cover first hard mask 401, including sidewall portions of first hard mask 401. At formed, first spacer layer 600 and second spacer layer 700 may be formed from different materials having different etch selectivities with respect to each other. For example, first spacer layer 600 may be formed from one or more materials such as a silicon oxide, and second spacer layer 700 may be formed from one or more materials such as a silicon nitride or a polysilicon.

In one embodiment, first spacer layer 600 and second spacer layer 700 may be formed with equal thicknesses. Further, first spacer layer 600 may be formed with a thickness such that the width of the portions of first spacer layer 600 formed on sidewall portions of first hard mask 401 are equal in width to line width "w" of first hard mask 401.

Since second spacer layer 700 serves to pattern material layer 300 during a subsequent process, second spacer layer 700 may be formed from a material having an etch selectivity with respect to material layer 300. In one embodiment, second spacer layer 700 is formed from the same material as first hard mask layer 400. In yet another embodiment, first spacer layer 600 may be formed from the same material as material layer 300. However, in a case where first spacer layer 600 is formed from a material having an etch selectivity with respect to material layer 300, damage to material layer 300 during a subsequent etch process may be prevented.

Figure 4:
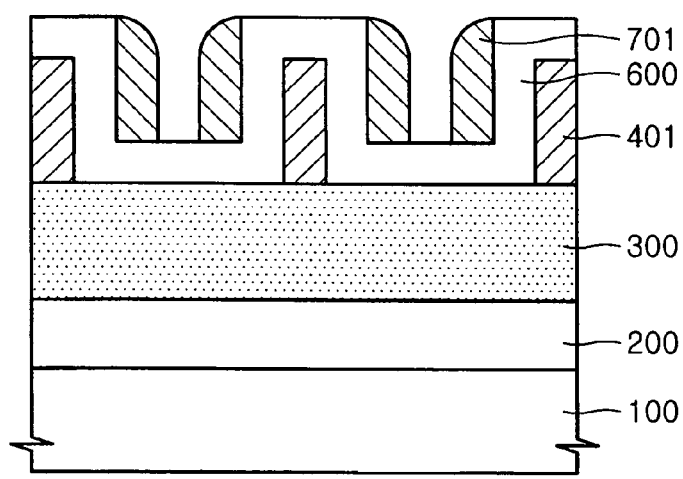

Referring to FIG. 4, second spacer layer 700 is spacer-etched, (e.g., isotropically dry-etched) to form a second hard mask 701 on sidewall portions of first hard mask 401. In this regard, and as shown in the illustrated example, second hard mask 701 is formed with the classic sidewall "spacer" shape on first hard mask 401. Any number of etch processes may be used to form second hard mask 701, but in one embodiment a spacer etch process is used having an etch selectivity with respect to first spacer layer 600. The spacer etch process is performed to expose a portion of first spacer layer 600 such that the mask elements of second hard mask 701 are aligned with mask elements of first hard mask 401 with portions of first spacer layer 600 disposed between these aligned sets of mask elements.

In this manner, the mask elements of second hard mask 701 may be formed such that a distance between two facing mask elements of second hard masks 701 (i.e., the mask elements not separated by some portion of first spacer layer 600) is equal to the line width of second hard mask 701, and/or is equal to the line width of a portion of first spacer layer 600 formed on the sidewall portions of first hard mask 401.

Figure 5:
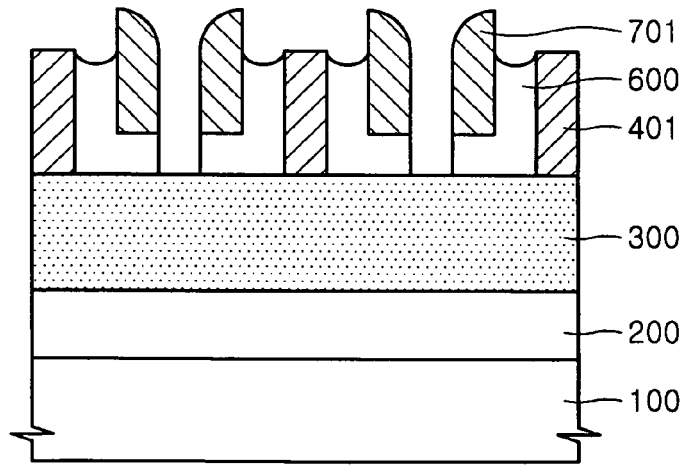
Figure 6:
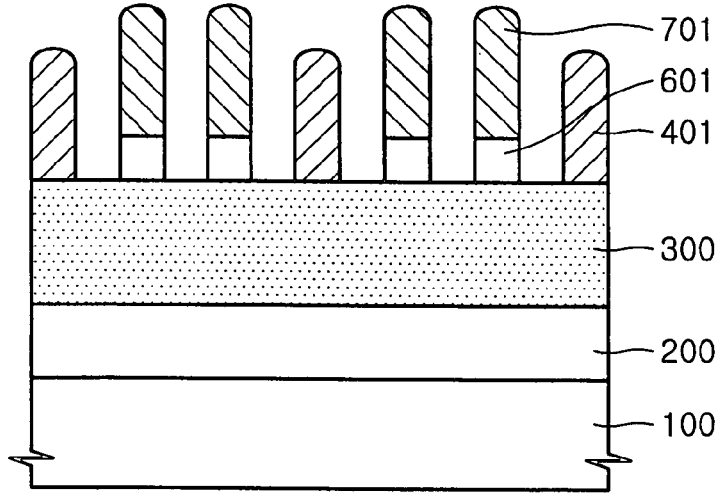

Referring to FIGS. 5 and 6, the exposed portions of first spacer layer 600 are spacer-etched (e.g., isotropically dry-etched) so as to be selectively etched and removed. As this selective, spacer etch process is performed, the upper surfaces of the mask elements of first hard mask 401 and the part of the sidewall previously covered by first spacer layer 600 are exposed as shown in FIG. 5. As the first and second masks, 401 and 701, are formed to have an etch selectivity with respect to first spacer layer 600, they effectively function as respective etch masks during the selective etch process(es).

Also during the selective, spacer etch process, portions of first spacer layer 600 disposed between adjacent mask elements of the first and second hard masks, 401 and 701, are selectively etched and removed, thereby exposing in part material layer 300. As the selective, spacer etch process may in some embodiments be an isotropic dry etch process, portions of first spacer pattern 601 may selectively remain in the resulting structure under mask elements of second hard mask 701, as shown in FIG. 6.

In the foregoing manner, two mask elements of second hard masks 701 may be formed on material layer 300 between adjacent mask elements of first hard masks 401. As noted above, individual mask elements in both first hard mask 401 and second hard mask 701 may be formed with the same line width. Further, these respective mask elements may be formed so as to be uniformly separated by a defined distance. This defined separation distance between adjacent mask elements may in one embodiment be equal to line width "w" described above. Thus, the minimum pitch of the hard mask formed by the combination of first hard mask 401 and second hard mask 701 may be reduced to about ⅓ the pitch otherwise provided by the initial (conventionally formed) first hard mask 401 shown in FIG. 2.

The result means that it is possible to realize patterns having a reduced pitch by as much as at least ⅓ the pitch of the patterns formed by conventionally available lithography equipment. Thus, even though employing lithography equipment and related processes having relatively low resolution, but it is possible to form much smaller pitch patterns that are as good as those formed by employing better (e.g., higher resolution) lithography equipment and related processes that are not nearly as available and come with relatively higher costs. For example, by using the teaching of the present invention a conventional KrF lithography process, may be used and yet provide a pitch pattern every bit as good as those achieved through the use of an ArF lithography process.

Referring again to FIG. 7, material layer 300 is now exposed through the combination of first hard mask 401 and second hard mask 701 and may be selectively etched using one of a number of conventional processes. Thus, a small pitch pattern 301 may be formed in material layer 300. In one embodiment, small pitch pattern 301 may take the form of repeated lines and spaces.

Figure 8:
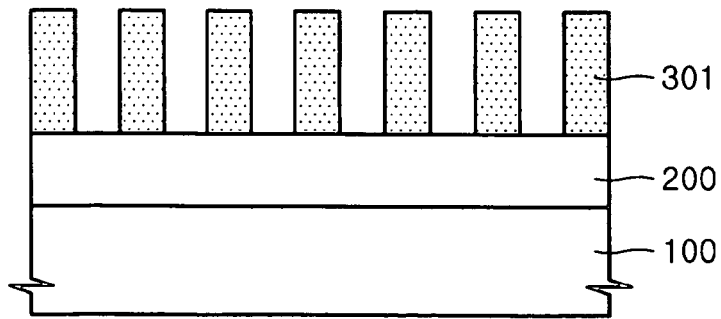

Referring to FIG. 8, first and second hard masks, 401 and 701, together with any underlying portions of spacer layer pattern 601 are selectively removed, thereby fully exposing small pitch pattern 301 formed from material layer 300. Small pitch pattern 301 may be used to form gate or bit line structures of a constituent semiconductor device formed on substrate 100. Alternately, small pitch pattern 310 may be used as a patterned hard mask, mold, damascene pattern, or the like for patterning some other element of a constituent semiconductor device.

Figure 9:
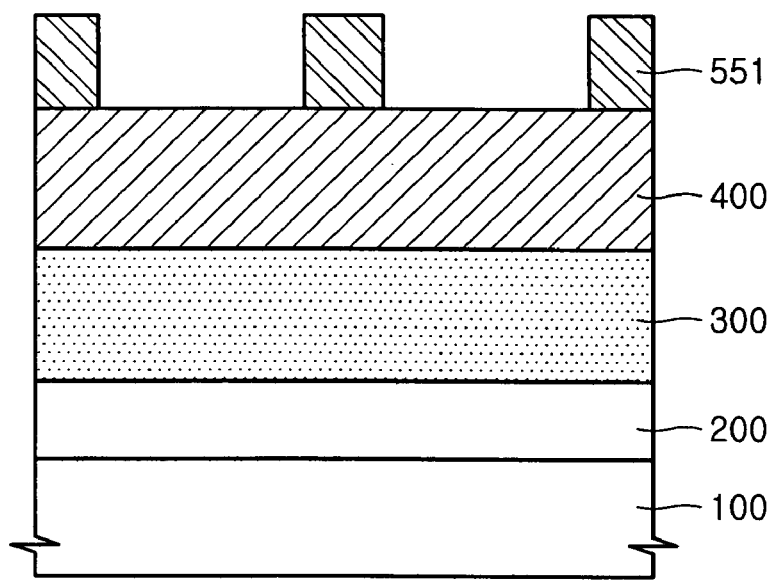
FIGS. 9 and 10 are sectional views schematically illustrating a method of forming small pitch patterns according to another embodiment of the present invention.
Figure 10:
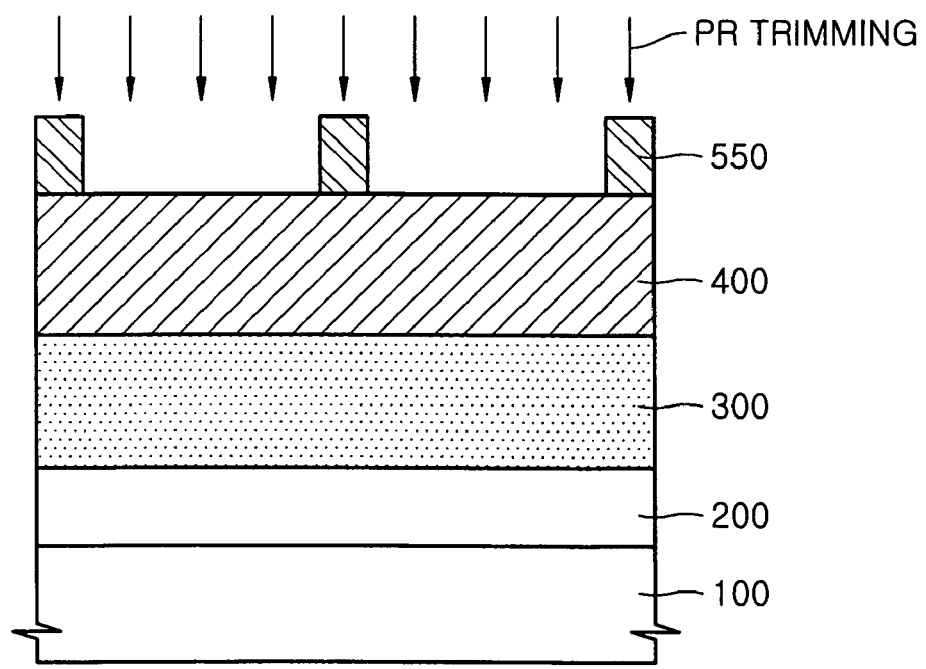

FIGS. 9 and 10 are sectional views schematically illustrating one method of forming a small pitch pattern having a defined line width according to one embodiment of the invention.

Referring to FIG. 9, a lithography process is performed on first hard mask layer 400. This process may take many forms, but in one embodiment a photoresist layer (PR) is deposited, exposed, and developed to form precursor photoresist pattern 551. Then, precursor photoresist pattern 551 is PR-trimmed to further reduce the line width and form first photoresist first pattern 550. PR-trimming may be accomplished, for example, by irradiating ultraviolet rays on precursor photoresist pattern 551, heating, or isotropically etching same to reduce the line width to a desired dimension.

In this manner, first hard mask 401 described with respect to FIG. 2 may also be patterned using direct PR-trimming to form first photoresist pattern 550.

Figure 11:
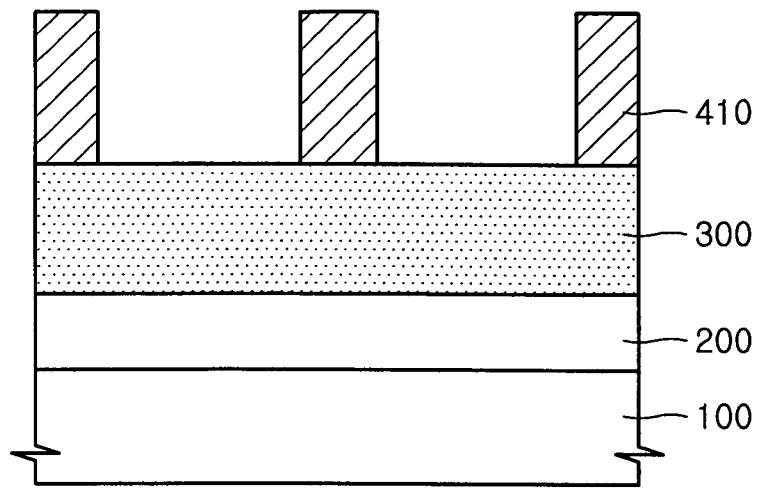
FIGS. 11 and 12 are sectional views schematically illustrating a method of forming a first hard mask having a small line width according to another embodiment of the invention.
Figure 12:
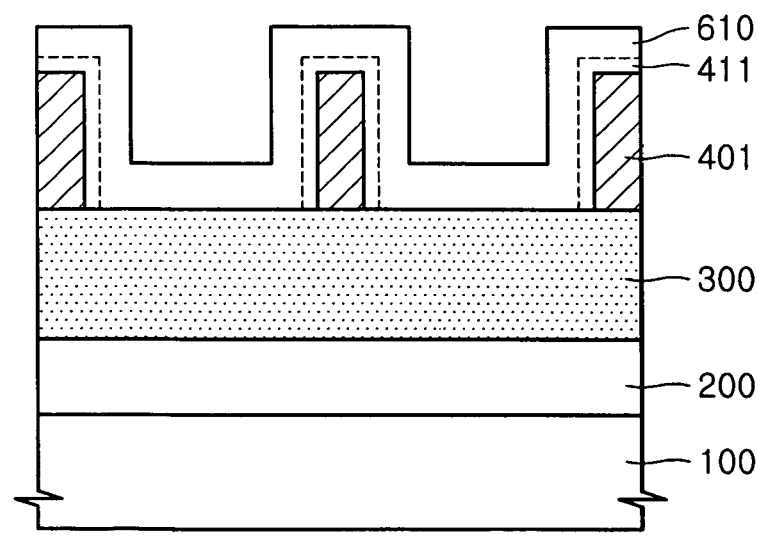

FIGS. 11 and 12 are sectional views schematically illustrating an alternate method of forming a first hard mask having a small line width according to another embodiment of the invention.

Referring to FIG. 11, a precursor hard mask pattern 410 is formed using conventional lithography and etch processes. Then, a first spacer layer 610 is formed on precursor hard mask pattern 410 as shown in FIG. 12. Precursor hard mask pattern 410 is oxidized during the process forming first spacer layer 610. Thus, a first hard mask 401 may be formed having a defined (e.g., reduced) line width as compared with precursor hard mask pattern 410. Thus, in the illustrated embodiment, first spacer layer 610 will be formed from a material composition including at least one oxide material. When first spacer layer 610 is formed on it, precursor hard mask pattern 410 will oxidize to a predetermined depth to form an oxidized portion 411 of precursor hard mask pattern 410. Subsequent removal of oxidized portion 411 forms first hard mask 401 having the defined line width.

In one embodiment, first spacer layer 610 is formed under the high temperature oxidation conditions in a conventional oxidation chamber. In this regard, first spacer layer 610 may be formed from material including at least one oxide, such as silicon oxide. Precursor hard mask pattern 410 may be formed from one or more oxidizable materials, such as polysilicon or silicon nitride.

Figure 13:
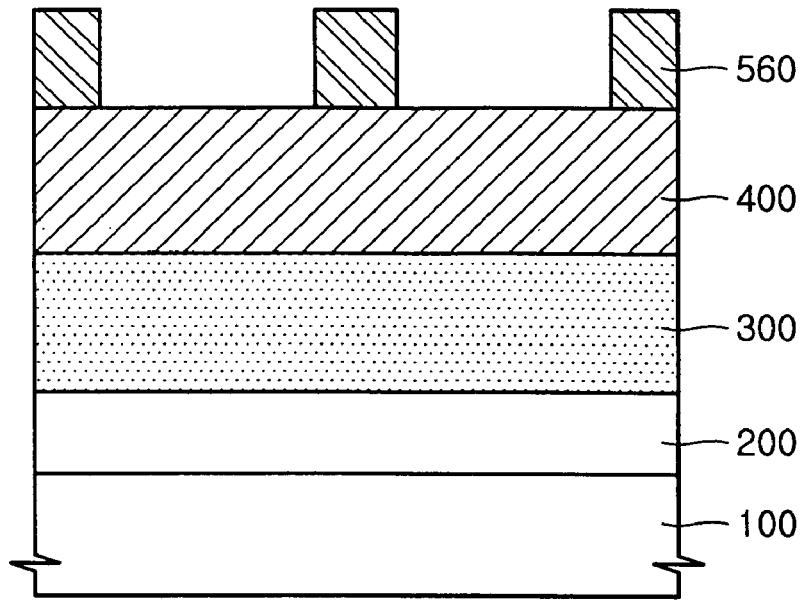
FIGS. 13 and 14 are sectional views schematically illustrating a method of forming a first hard mask having a small line width according to another embodiment of the invention.
Figure 14:
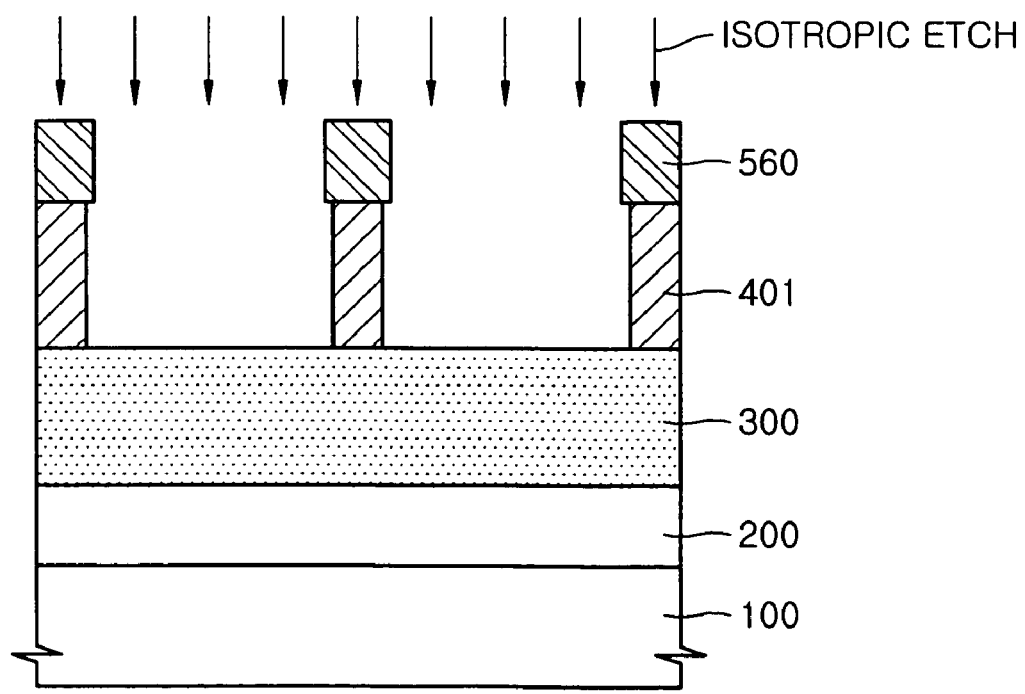

FIGS. 13 and 14 are sectional views schematically illustrating another method of forming a first hard mask having a small line width according to another embodiment of the invention.

Referring to FIGS. 13 and 14, a second photoresist pattern 560 is formed on first hard mask layer 400, such as that shown in FIG. 1. Then, the exposed portions of first hard mask layer 400 are selectively etched (e.g., by applying an isotropic etch process) using second photoresist pattern 560 as an etch mask. In this manner, a line width for first hard mask 401 may be obtained that is smaller than the line width obtained by second photoresist pattern 560.

Figure 15:
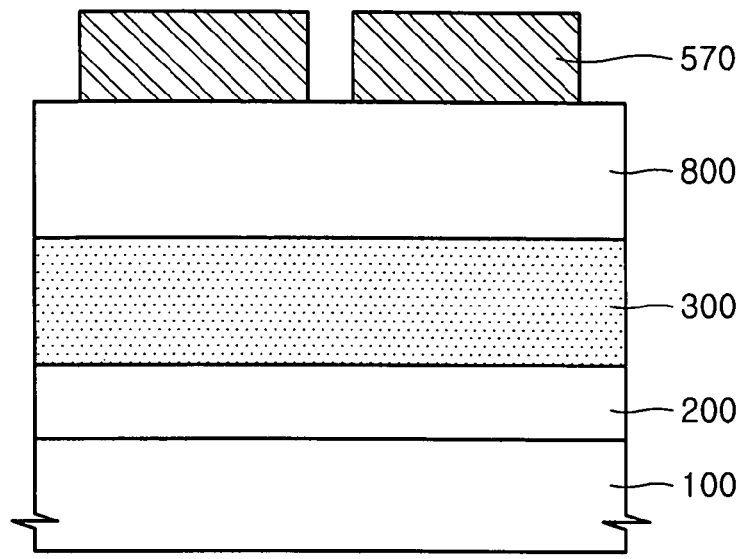
FIGS. 15 through 17 are sectional views schematically illustrating a method of forming a first hard mask having a small line width using a damascene method according to another embodiment of the invention.
Figure 16:
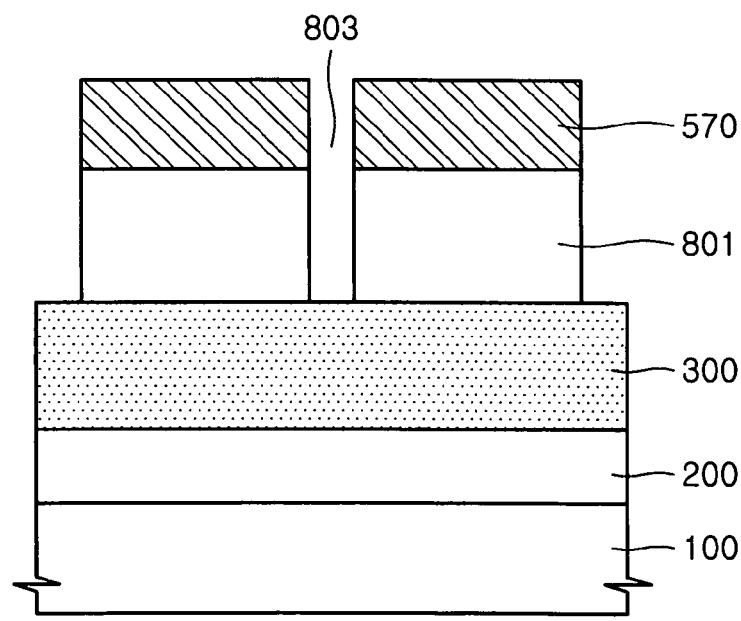
Figure 17:
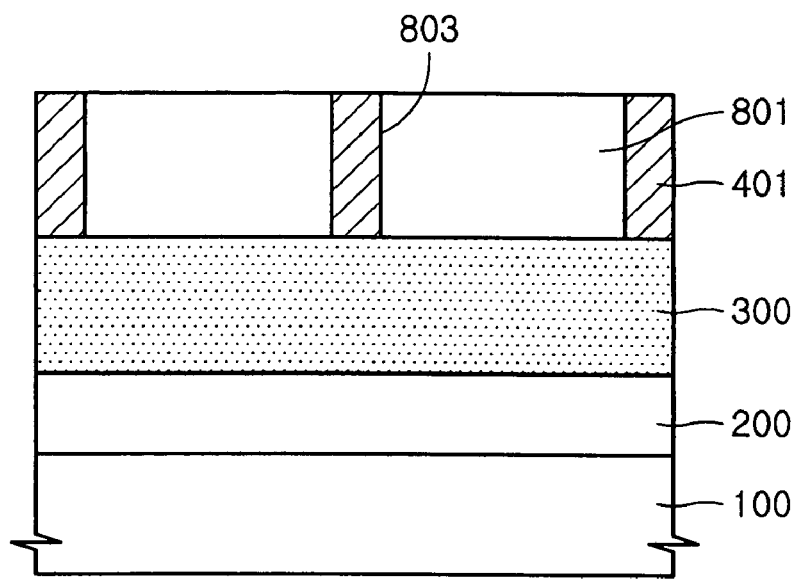

FIGS. 15 through 17 are sectional views schematically illustrating a method of forming a first hard mask having a defined small line width using a damascene method according to another embodiment of the invention.

Referring to FIG. 15, a mold layer 800 for a damascene pattern is formed on material layer 300. Mold layer 800 may be formed from an insulating material such as silicon oxide, or the like. Then, a third photoresist pattern 570 is formed on mold layer 800.

Referring to FIG. 16, mold layer 800 is patterned using third photoresist pattern 570 as an etch mask to thereby form a mold 801 as a damascene pattern. Mold 801 may have a line-shaped groove 803.

Referring to FIG. 17, third photoresist pattern 570 is then removed. After a layer is deposited to fill groove 803 of mold 801, an overall etch-back process or a chemical mechanical polishing (CMP) process is performed to thereby form a first hard mask 401 having a pattern defined by mold 801. During this process, a spacer may be attached to sidewall portions of groove 803 and the outer edges of mold 801 to further reduce the resulting line width of first hard mask 401.

Figure 7:
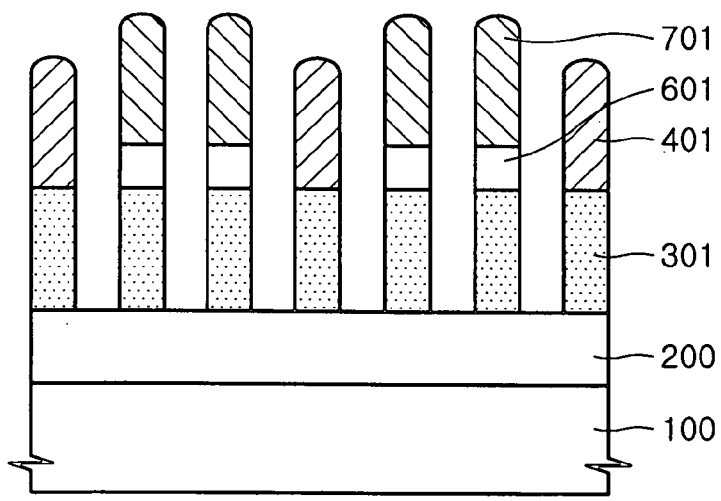

In any one of the foregoing embodiments, and as conventionally recognized an etch stop layer may be employed to stopping a constituent etch process from damaging a lower layer, such as, for example the etch process used to expose material layer 300 through first spacer layer 600, as shown in FIGS. 5 and 6, or during the process used to form small pitch pattern 301, as shown in FIG. 7.

Figure 18:
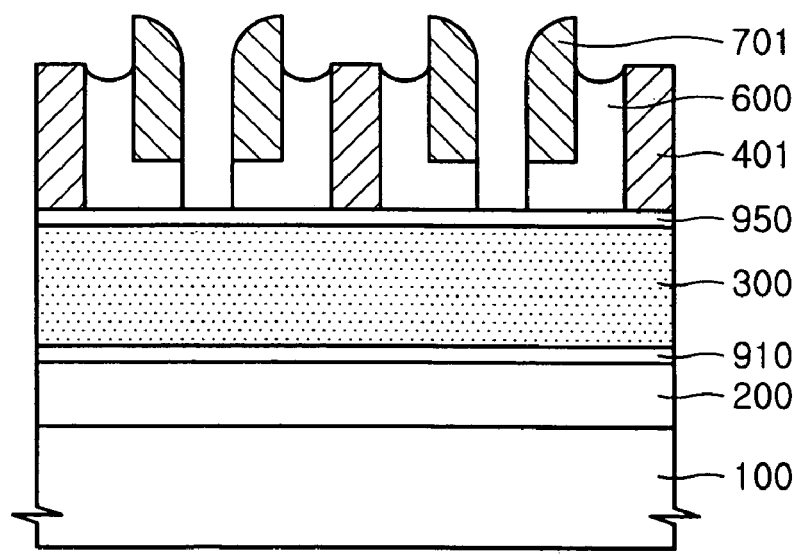
FIGS. 18 through 20 are sectional views schematically illustrating a process using an etch stop layer according to an embodiment of the invention.
Figure 19:
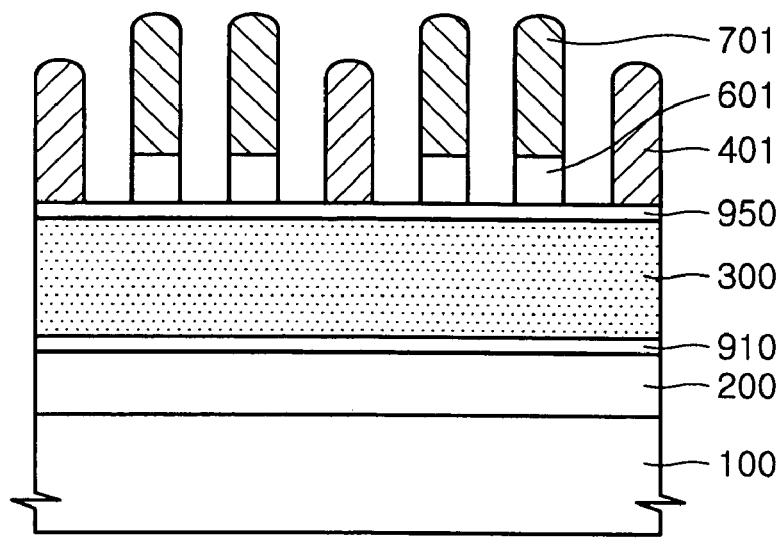
Figure 20:
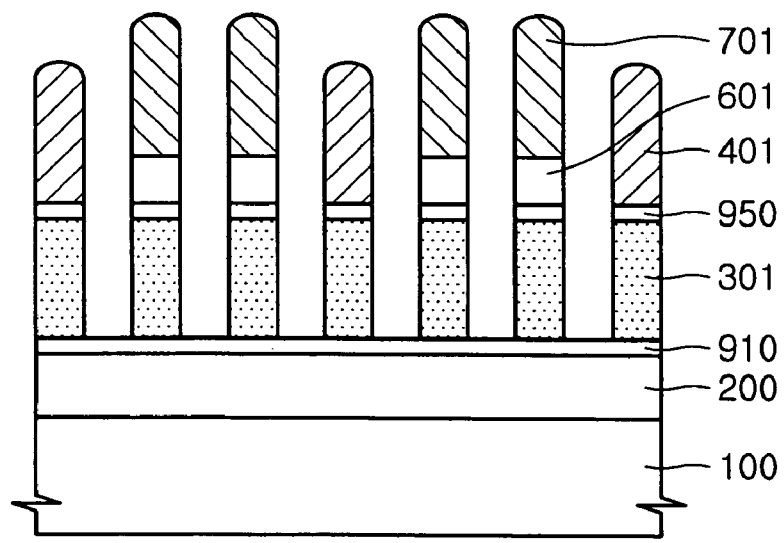

FIGS. 18 through 20 are sectional views schematically illustrating a process using an etch stop layer according to another embodiment of the invention.

Referring to FIG. 18, a first etch stop layer 910 may be formed at the interface between lower layer 200 and material layer 300. First etch stop layer 910 may be formed from a material having an etch selectivity with respect to material layer 300.

Further, a second etch stop layer 950 may be formed on material layer 300. Second etch stop layer 950 may be formed from a material having an etch selectivity with respect to first hard mask layer 400, or may be formed from a material having an etch selectivity with respect to first spacer layer 600.

Thus, the etch process adapted to pattern first hard mask layer 400 into first hard mask 401, as shown in FIG. 2, may be stopped by second etch stop layer 950. Thus, material layer 300 can be effectively protected from damage by the etch process.

Further, when first spacer layer 600 is selectively etched and removed, as shown in FIGS. 18 and 19, the selective etch may be stopped by second etch stop layer 950. Thus, material layer 300 may be effectively protected from damage by the selective etch.

Referring to FIG. 20, a selective etch process adapted to pattern material layer 300 using the combination of first and second hard masks, 401 and 701, as etch mask may be stopped by first etch stop layer 910. Thus, lower layer 200 may be protected from damage by the etch process forming small pitch pattern 301.

The first and second etch stop layers, 910 and 950, may be singularly or collectively formed from a material such as silicon oxynitride (SiON), or the like.

Figure 21:
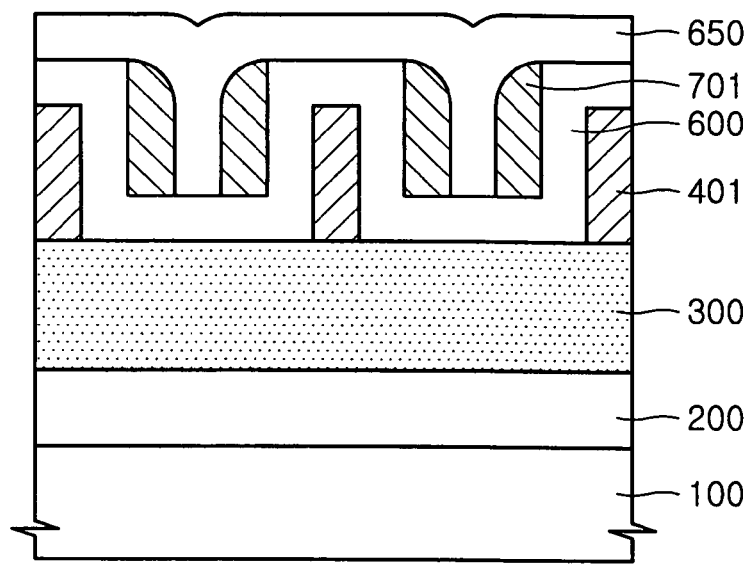
Figure 22:
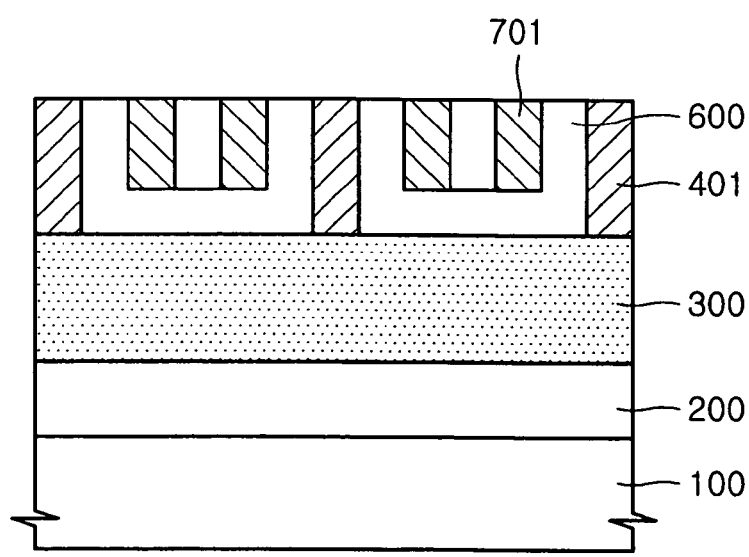

FIGS. 21 through 23 are sectional views schematically illustrating a planarizing process adapted for use in a method of forming small pitch patterns according to another embodiment of the invention.

Referring to FIG. 21, after performing a spacer etch process to form second hard mask 701, as shown in FIG. 4, a sacrificial layer 650 may be formed to fill a gap between the spacer-shaped second hard mask 701. Sacrificial layer 650 may be formed from the same material as that forming first spacer layer 600, or may be composed of a material being etched along with first spacer layer 600. Sacrificial layer 650 may be formed by depositing an insulating material having an etch selectivity with respect to second hard mask 701, for example, an oxide group of an insulating material such as SOG (spin on glass), Fox (flowable oxide), TOSZ (poly silazane), and the like.

Referring to FIG. 22, after sacrificial layer 650 is deposited, the overall surface of sacrificial layer 650 may be planarized using an etch-back process or a CMP process. The planarizing process may be performed to expose the upper surface of at least second hard mask 701. Or, the planarizing process may be performed until the upper surface of underlying first hard mask 401 is exposed, or until the structure even below first hard mask 401 is planarized. Or, the planarizing process may be performed to planarize a portion of first hard mask 401. Thus, the height of second hard mask 701 may be equal to a height of first hard mask 401.

Referring to FIG. 23, using the combination of first and second hard masks, 401 and 701, as an etch mask, as described in reference to FIGS. 5 and 6, first spacer layer 600 and sacrificial layer 650 between the masks are selectively etched and removed.

In a case employing sacrificial layer 650 and using a planarizing process, portions of material layer 300 exposed between mask elements of second hard mask 701, as shown in FIG. 5, may be effectively protected from damage during the process of removing first spacer layer 600.

Alternatively, another separate lower layer pattern may be formed below first hard mask 401, as shown in FIG. 6. That is, first hard mask 401 may be formed substantially to have a double layer structure like the structure of second hard mask 701 and first spacer layer pattern 601.

FIGS. 24 through 30 are sectional views schematically illustrating a method of forming a hard mask having of double layer structure according to another embodiment of the invention.

Referring to FIG. 24, a third hard mask layer 670 different from first hard mask layer 400 may be formed at the interface between material layer 300 and first hard mask layer 400, as described in reference to FIG. 1. Third hard mask layer 670 may be formed from the same material as that forming first spacer layer 600, as described in FIG. 3, or may be formed from an insulating material of the same group as that forming first spacer layer 600. In one embodiment, third hard mask layer 670 may be formed to a thickness equal to that of first spacer layer 600. Then, a first photoresist pattern 550, as described in FIG. 1, is formed on first hard mask layer 400.

Figure 25:
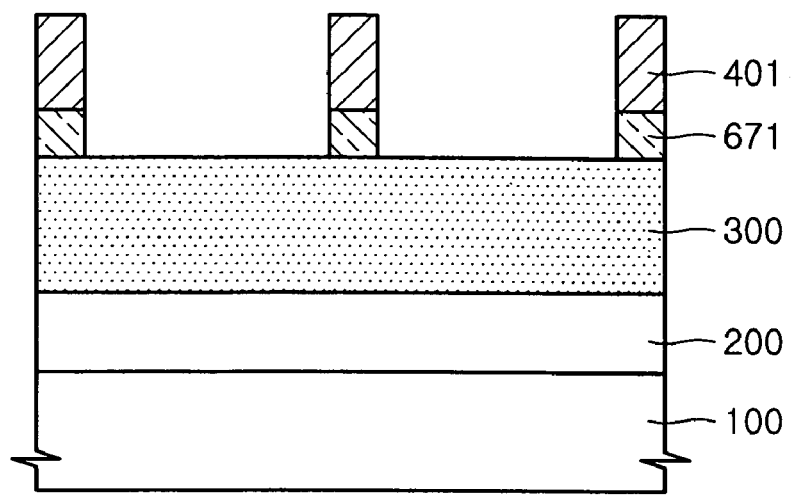

Referring to FIG. 25, a first hard mask 401 is formed by performing a planarizing process, as described in reference to FIG. 2. At this time, a selective etch process performed during a patterning process is also performed to pattern third hard mask layer 670 below first hard mask 401. Thus, a third hard mask 671 may be formed having the same shape as first hard mask 401. The double layer structure, in which third hard mask 671 and first hard mask 401 are stacked, is understood to serve as a hard mask having the same function as first hard mask 401, as described in reference to FIG. 2.

Figure 26:
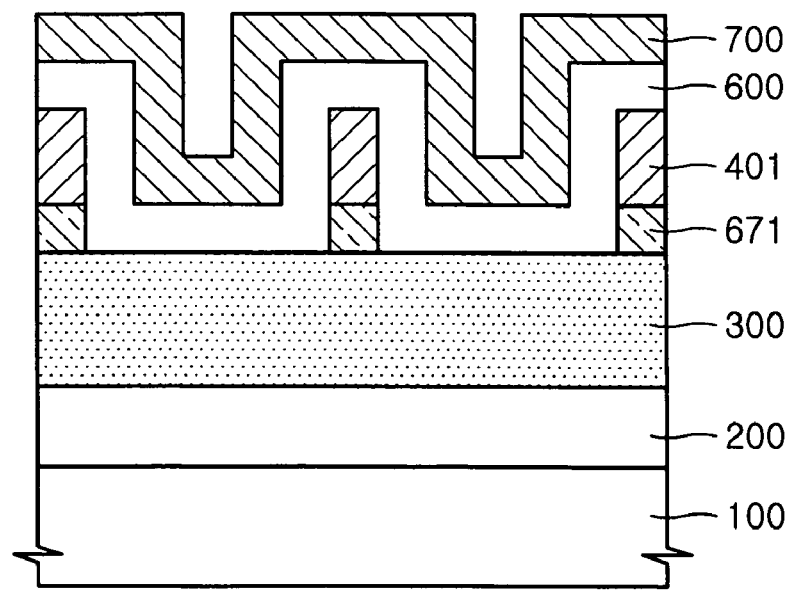

Referring to FIG. 26, a first spacer layer 600 and a second spacer layer 700 are formed as described in reference to FIG. 3. In this manner, second spacer layer 700 is formed over material layer 300 with an additional deposition height equal to that of third hard mask 671.

Figure 27:
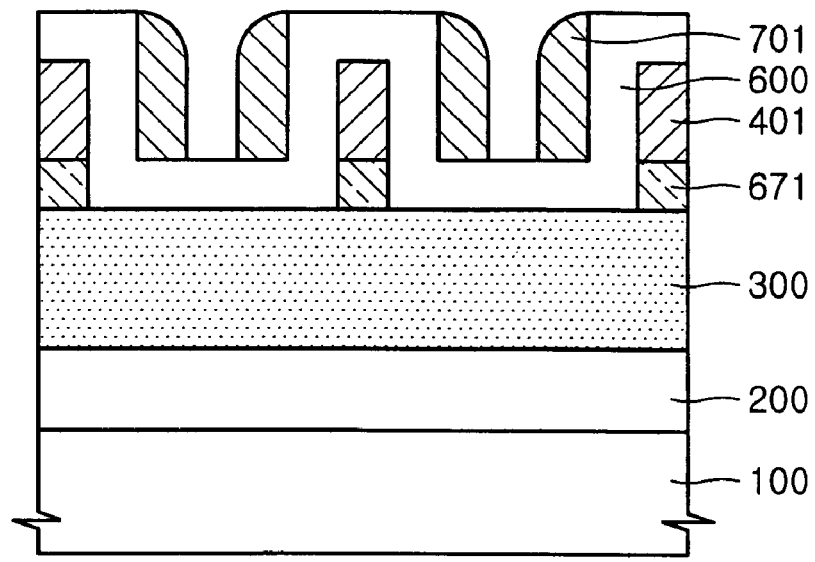

Referring to FIG. 27, a second hard mask 701 having mask elements spaced apart and in parallel between the mask elements of first hard mask 401 is formed, as described in reference to FIG. 4.

Figure 28:
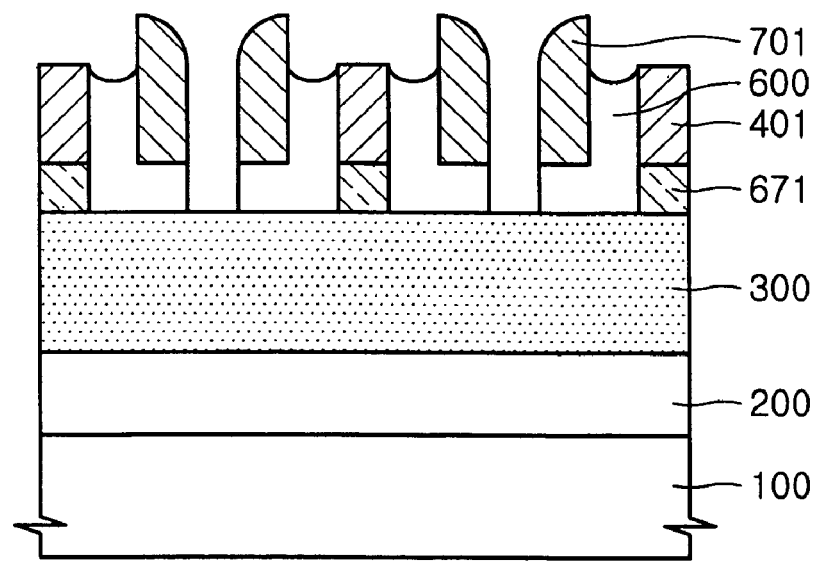
Figure 29:
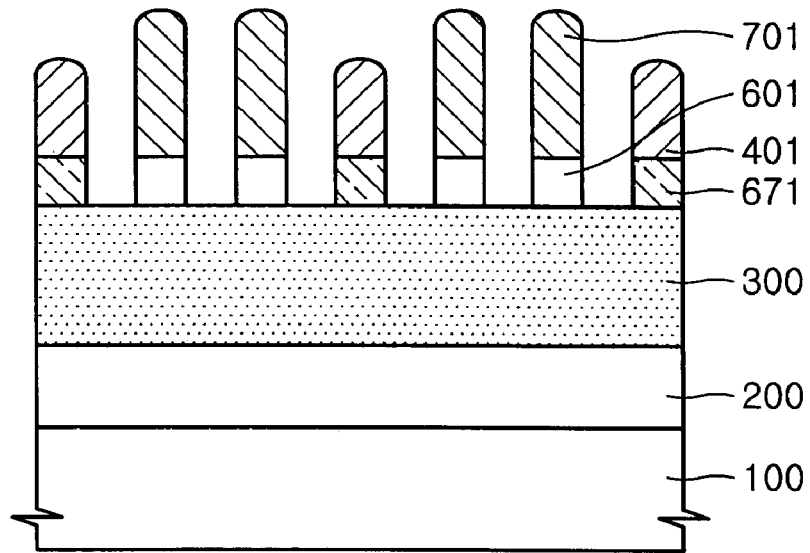

Referring to FIGS. 28 and 29, a first spacer layer 600 between first hard mask 401 and second hard mask 701 is selectively removed, as described in reference to FIGS. 5 and 6, so as to selectively expose a portion of material layer 300.

Figure 30:
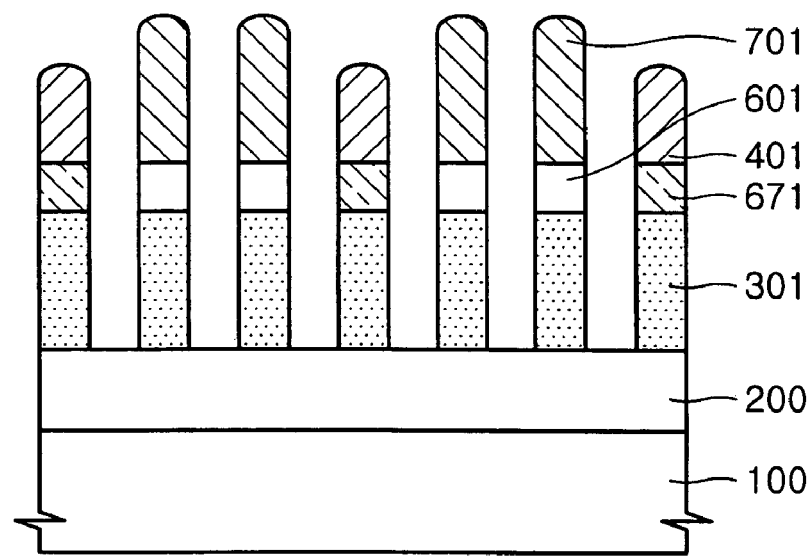

Referring to FIG. 30, the exposed portions of material layer 300 may be selectively etched, using the double layer hard mask structure formed by first hard mask 401 and third hard mask 671, and the double layer hard mask structure formed by second hard mask 701 and first spacer layer pattern 601 as an etch mask, as described in reference to FIGS. 7 and 8. Thus, a small pitch pattern 301 may be formed.

As such, when third hard mask 671 is aligned to overlap first hard mask 401 below first hard mask 401, the resulting double layer hard mask structure (e.g., the combination of first hard mask 401 and third hard mask 671, and the combination of second hard mask 701 and first spacer layer pattern 601) may alleviate the height difference that would otherwise occur.

Alternately, the spacer-shaped second hard mask 701 may be used as described above together with a selective etch process adapted to trim edge portions from second hard mask 701 to separate second hard mask 701 on both sides of first hard mask 401.

Figure 31:
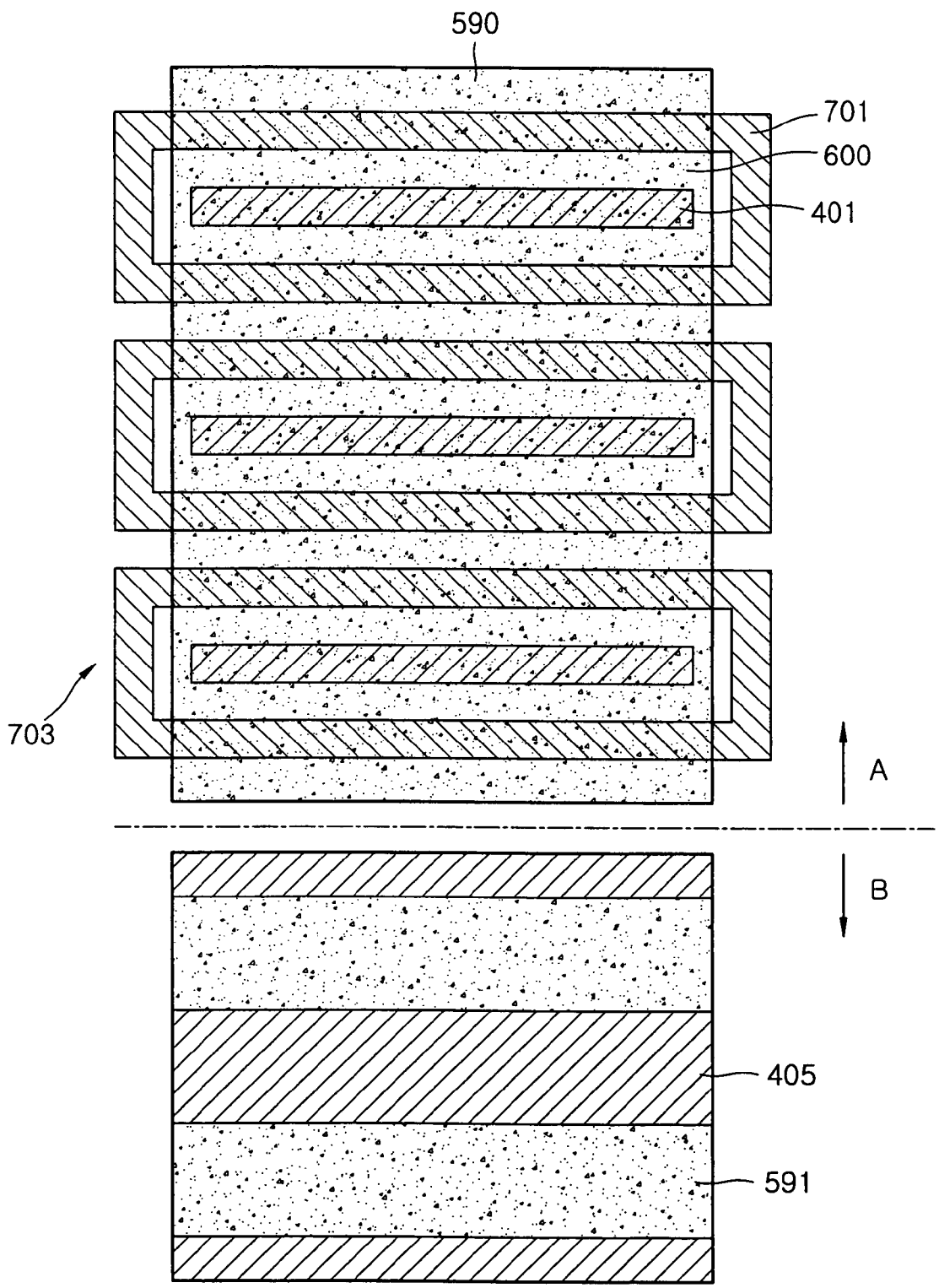
FIGS. 31 and 32 are a plan view and a sectional view schematically illustrating a second hard mask trimming process according to an embodiment of the invention.
Figure 32:
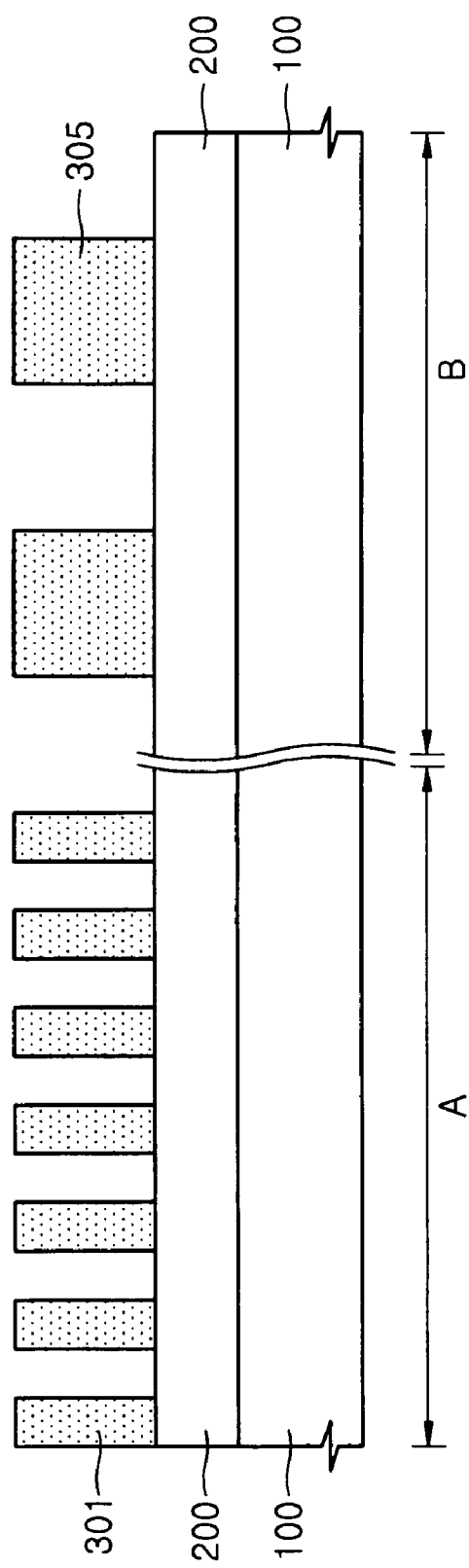

FIG. 31 is a plan view and FIG. 32 is a related sectional view schematically illustrating a second hard mask trimming process according to another embodiment of the invention.

Referring to FIG. 31, in a case where patterning second hard mask 701 as a spacer shape, as described in reference to FIG. 4 or FIG. 7, an end portion 703 of second hard mask 701 outside the end portion of first hard mask 401 patterned as a line pattern shape may be formed in a connected fashion. Preferably, in a case where the small pitch pattern is formed by repeating lines and spaces, end portion 703 of second hard mask 701 will be selectively removed.

Thus, by patterning second hard mask 701 as a spacer shape, and forming a fourth photoresist pattern 590 as an etch mask for selectively exposing the end portion 703 of second hard mask, a spacer trimming process may be performed to selectively etch and remove end portion 703 of second hard mask 701. Thus, the second hard mask 701, as described in FIG. 32, is formed.

The small pitch pattern 301 (see, FIG. 8) formed by lines and spaces may be in a pattern dense region "A" of a wafer where semiconductor devices are formed. In the fabrication of semiconductor devices, a region "B" where relatively large patterns are formed may be disposed around the dense region where relatively small pitch patterns are formed.

For example, a line pattern 305 (FIG. 32) of a relatively large line width may be disposed in a peripheral circuit region or a core region of a semiconductor device. Further, in the case of a flash memory device, it is required that patterns of a relatively large pitch be formed between repeated patterns of a relatively small pitch.

In this case, the patterns of a relatively large pitch can be patterned during the spacer trimming process of selectively etching and removing end portion 703 of second hard mask 701 and separating as shown in FIG. 31. For example, when a fourth photoresist pattern 590 is formed as shown in FIG. 31, a fifth photoresist pattern 591 may be formed along with the fourth photoresist pattern 590 on a first hard mask layer second portion 405 existing in the region "B" having relatively large patterns.

In this manner, second portion 405 of first hard mask layer 400 may be maintained without being patterned during a former operation in the region "B" having relatively large patterns. The fifth photoresist pattern 591 may be used as an etch mask for forming patterns of a line pattern shape, and used as an etch mask during an etch process for spacer trimming so that an exposed portion of second portion 405 of first hard mask layer 400 is selectively etched and removed. Thus, an additional fourth hard mask for a pattern 305 of a relatively large pitch as shown in FIG. 32 may be formed by patterning second portion 405 of first hard mask layer 400.

In the meantime, the pattern 305 of a relatively large pitch may be patterned during the spacer trimming process, or may be patterned together during the process of forming first hard mask 401.

FIGS. 33 and 34 are sectional views schematically illustrating a method of forming various pitch patterns together according to another embodiment of the invention.

Referring to FIG. 33, when first and second hard masks, 401 and 701, are formed, hard mask patterns, such as a fifth hard mask 404 and a sixth hard mask 406 having a line width different from that of first hard mask 401 or/and having a pitch with a neighboring pattern different from that of first hard mask 401, may be patterned from first hard mask layer 400 (FIG. 24), as described in reference to FIGS. 25 through 27.

In this case, second hard mask 701 may be patterned, or the seventh hard mask 705 having a line width larger than that of second hard mask 701 may be patterned by adjusting a distance between the sixth hard masks 406 or between the fifth hard mask 404 and the sixth hard mask 406.

Further, if a distance between the sixth hard masks 406 is quite reduced, for example, the distance becomes narrower than two times the thickness of the first spacer layer 600, first spacer layer 600 fills a void 707 between the sixth hard masks 406. Thus, second hard mask 701 is not generated in this portion. Since the hard masks 401, 404, 406, 701, 707 of various line widths or pitches can be patterned at an equal height level to be aligned in parallel, in the case of patterning material layer 300 using hard masks 401, 404, 406, 701, 707, the patterns 301, 303, 305, 307 having various line widths or/and pitches can be also formed as shown in FIG. 34. That is, various patterns such as a relatively small pitch fine pattern 301, a relatively large-sized pattern 305, a middle-sized pattern 303, and a relatively large pitch fine pattern 307 may be formed at one time.

Embodiments of the invention have been described above in relation to cases wherein double spacer layers 600 and 700 are sequentially formed. Further spacer-etching has been suggested to form spacer-shaped mask elements of second hard mask 701 between the mask elements of first hard masks 401 with uniform spacing from each other, but any reasonable number of plural spacer layers may be thus formed. Still further, spacer-shaped hard mask elements for mask patterns such as second hard masks 701 may be formed between the mask elements of first hard masks 401. Thus, even smaller pitch finer patterns 301 may be formed.

According to the embodiments of the invention described above, line and space patterns of 50 nm or less may be formed using conventionally available lithography equipment.

According to the present invention, the pitch for the final pattern thus formed may be reduced to at least 33% or more as compared with the pitch of a pattern initially formed using such conventional lithography equipment. Even though a lithography process having relatively low resolution (and corresponding low costs) is performed using, for example, a KrF light source, the process may nonetheless result in very small pitch patterns, such as those provided by the use of more expensive lithography equipment, such as an ArF light source.

In order to form a line and space pattern having a 45 nm pitch, for example a $F_2$ excimer laser light source having a shorter wavelength of 153 nm, or ArF immersion lithography technology using a 193 nm wavelength must normally be used. However, embodiments of the invention provide similarly small pitch patterns while using lithography equipment such as a 248 nm wavelength KrF excimer laser light source.

While the present invention has been particularly shown and described with reference to exemplary embodiments, it will be understood by those of ordinary skill in the art that various changes in form and details may be made therein without departing from the scope of the present invention as defined by the following claims.

What is claimed is:

1. A method of forming small pitch patterns comprising:
   forming a material layer on a semiconductor substrate;

forming a first hard mask on the material layer, wherein the first mask layer is characterized by a smaller line width for mask elements than a separated distance between adjacent mask elements;

forming a first spacer layer on the first hard mask to covering sidewall portions of the first hard mask;

forming a second spacer layer on the first spacer layer, the second spacer layer having an etch selectivity with respect to the first spacer layer;

forming a spacer pattern-shaped second hard mask on sidewall portions of the first hard mask by spacer-etching the second spacer layer;

selectively removing a portion of the first spacer layer between the first hard mask and the second hard mask;

forming a small pitch pattern by selectively etching the material layer using the combination of the first and second hard masks as an etch mask, and forming a third hard mask having a line width or a pitch different from that of the first hard mask concurrently when forming the first hard mask.

2. The method according to claim 1, wherein forming the first hard mask comprises:

forming a first hard mask layer having an etch selectivity relative to the material layer;

forming a photoresist pattern on the first hard mask layer; and patterning the first hard mask layer using the photoresist pattern as an etch mask.

3. The method according to claim 2, further comprising trimming the photoresist pattern to reduce a line width of the photoresist pattern.

4. The method according to claim 2, further comprising isotropically etching the first hard mask layer when patterning the first hard mask layer such that a line width of the first hard mask is further reduced from that of the photoresist pattern.

5. The method according to claim 2, wherein the first hard mask layer is formed from different double layers, wherein a lower layer of the double layers is formed with a thickness equal to that of the first spacer layer.

6. The method according to claim 1, wherein forming the first hard mask comprises:

forming a mold having a line pattern-shaped groove on the material layer;

forming a first hard mask layer filling the groove; and forming the first hard mask patterned in accordance with the shape of the groove by selectively removing the mold.

7. The method according to claim 1, wherein the first hard mask and the second hard mask are formed from the same material.

8. The method according to claim 1, wherein the first spacer layer is formed such that the line width for a portion of the first spacer layer covering a sidewall portion of the first hard mask is equal to the line width of the first hard mask.

9. The method according to claim 1, wherein the second spacer layer is formed such that the line width of a portion of the second spacer layer covering a sidewall portion of the first hard mask is equal to the line width of the first hard mask.

10. The method according to claim 1, wherein the second hard mask is formed such that the line width of the second hard mask is equal to the line width of the first hard mask.

11. The method according to claim 1, wherein spacer-etching the second spacer layer comprises patterning a fourth hard mask from the second spacer layer, wherein the fourth hard mask has a line width or a pitch different from that of the second hard mask in accordance with a spaced distance between mask elements of the first hard mask.

12. The method according to claim 1, further comprising forming a first etch stop layer on the material layer before forming the first hard mask layer.

13. The method according to claim 12, further comprising forming a lower layer on the substrate and forming a second etch stop layer on the lower layer before forming the material layer.

14. The method according to claim 1, after forming the second hard mask, the method further comprising:

forming a sacrificial layer filling a gap between mask elements of the second hard masks on the first spacer layer; and planarizing the sacrificial layer, wherein selectively removing the second spacer layer portion further comprises selectively etching portions of the sacrificial layer remaining after planarizing to expose portions of the first spacer layer.

15. The method according to claim 1, further comprising repeating the formation of the first and second spacer layers a number of times.

16. The method according to claim 1, after forming the spacer pattern-shaped second hard mask, the method further comprising spacer-trimming to separate the second hard mask into both sides of the first hard mask.

17. The method according to claim 16, further comprising patterning another portion of the material layer to form a second pattern having a line width or pitch different from that of the small pitch pattern.

18. A method of forming small pitch patterns comprising:

forming a material layer on a semiconductor substrate;

forming a first hard mask on the material layer, wherein the first mask layer is characterized by a smaller line width for mask elements than a separated distance between adjacent mask elements;

forming a first spacer layer on the first hard mask to covering sidewall portions of the first hard mask;

forming a second spacer layer on the first spacer layer, the second spacer layer having an etch selectivity with respect to the first spacer layer;

forming a spacer pattern-shaped second hard mask on sidewall portions of the first hard mask by spacer-etching the second spacer layer;

selectively removing a portion of the first spacer layer between the first hard mask and the second hard mask; and forming a small pitch pattern by selectively etching the material layer using the combination of the first and second hard masks as an etch mask, wherein forming the first spacer layer comprises; performing an oxidation process to oxidize a portion of the first hard mask to a predetermined depth to thereby reduce a line width of the first hard mask.

19. A method of forming small pitch patterns comprising:

forming a material layer on a semiconductor substrate;

forming a first hard mask on the material layer, wherein the first mask layer is characterized by a smaller line width for mask elements than a separated distance between adjacent mask elements;

forming a first spacer layer on the first hard mask to covering sidewall portions of the first hard mask;

forming a second spacer layer on the first spacer layer, the second spacer layer having an etch selectivity with respect to the first spacer layer;

forming a spacer pattern-shaped second hard mask on sidewall portions of the first hard mask by spacer-etching the second spacer layer;

selectively removing a portion of the first spacer layer between the first hard mask and the second hard mask; and forming a small pitch pattern by selectively etching the material layer using the combination of the first and second hard masks as an etch mask, wherein the first spacer layer and the material layer are formed from the same material.

* * * * *